United States Patent [19]
Gardner et al.

[11] Patent Number: 5,969,394
[45] Date of Patent: Oct. 19, 1999

[54] METHOD AND STRUCTURE FOR HIGH ASPECT GATE AND SHORT CHANNEL LENGTH INSULATED GATE FIELD EFFECT TRANSISTORS

[75] Inventors: Mark I. Gardner, Cedar Creek; Daniel Kadosh, Austin, both of Tex.

[73] Assignee: Advanced Micro Devices, Inc., Sunnyvale, Calif.

[21] Appl. No.: 08/993,385

[22] Filed: Dec. 18, 1997

[51] Int. Cl.$^6$ .......................... H01L 29/76; H01L 29/94; H01L 31/062; H01L 31/113
[52] U.S. Cl. ............................................. 257/401; 257/346
[58] Field of Search ..................................... 257/401, 346; 438/163, 180

[56] References Cited

U.S. PATENT DOCUMENTS 5,115,290  5/1992  Murakami et al. .
5,514,891  5/1996  Abrokwah et al. .
5,578,518  11/1996  Koike et al. .

*Primary Examiner*—Stephen D. Meier

[57] ABSTRACT

A method and structure are provided for an IGFET which has a short conduction channel length. The short channel IGFET functions more rapidly than do longer conduction channel devices. Also the invention includes a dielectric layer with a high dielectric constant value (K) to prolong the longevity of the device. A lightly doped drain region similarly preserves the integrity of the IGFET by protecting the gate from "hot electron injection." The method and structure provide an IGFET with increased performance without compromising the IGFET's reliability or longevity.

11 Claims, 4 Drawing Sheets

METHOD AND STRUCTURE FOR HIGH ASPECT GATE AND SHORT CHANNEL LENGTH INSULATED GATE FIELD EFFECT TRANSISTORS

RELATED APPLICATIONS

This application is related to the co-filed and commonly assigned application entitled "Method of Channel Length Reduction Using Air Channel Mosfet Design", which is hereby incorporated by reference.

FIELD OF THE INVENTION

The present invention relates generally to semiconductor integrated circuits. More particularly, it pertains to the method and structure for high aspect gate and short channel length insulated gate field effect transistors.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a insulating layer such as a dielectric layer. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

There is a desire to reduce the dimensions of the IGFET. The impetus for device reduction comes from two directions. One is the desire to increase the number of individual IGFETs that can be placed onto a single silicon chip or die. More IGFETs on a single chip leads to increased finctionality. A second desire is to improve performance, and particularly the speed, of the IGFET transistors. Increased speed allows for a greater number of operations to be performed in less time. IGFETs are used in great quantity in computers where the push to obtain higher operation cycle speeds demands faster IGFET performance.

One method to increase the speed of an IGFET is to reduced the length of the conduction channel underneath the gate and dielectric layer regions. However, as IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

As shown above, a threshold point exist where heightened speed and reduced dimensions will lead to IGFET breakdown. Conventional approaches have encountered difficulty trying to reconcile the methods for decreasing the hot carrier effects and the methods for improving performance. Also, it is desirable to achieve improved these sought after results without adding costly processing steps. Thus, it is an objective to uncover newly configured IGFET structures and the methods to produce the same which will increase performance increase and while not compromise the IGFET's longevity or fabrication costs.

SUMMARY OF THE INVENTION

A method for forming a device which has a reduced channel length and high aspect gate profile is provided. The method of fabrication includes forming a dielectric layer on the surface of a substrate. A gate is formed on the surface of the dielectric layer. The gate has opposing sides. The length of the dielectric layer underneath a portion of only one of the opposing sides of the gate is reduced while maintaining the original size of the gate. Source and drain regions are then implanted into the substrate. The method includes forming a lightly doped drain region underneath the portion of the gate wherein the dielectric layer was removed.

In one embodiment, the length of the dielectric layer is reduced by masking the source region and performing a buffered oxide etch to remove the dielectric layer from underneath a portion of the gate adjacent to the drain region. The buffered oxide etch does not attack the gate material. In an alternative embodiment, the etching is performed using a hydroflouric acid etch (HF). In still another embodiment, the etching process is a plasma etch.

A device is provided which has a reduced channel length and high aspect gate profile. The device includes a semiconductor substrate with a dielectric layer on the surface of the substrate. There is gate provided on the surface of the dielectric layer. In the device, a portion of the gate is greater in length than the dielectric layer and extends past the dielectric layer underneath. The device includes a source region on the substrate and a drain region on the substrate. In one embodiment, the gate length exceeds the dielectric layer length on a side adjacent to the drain region. The source and drain regions are self-aligned to the gate. A lightly doped drain region is provided on the substrate and underneath the portion of the gate which is longer in length than the dielectric layer.

An information handling system is also provided which includes the above device. The system has a central processing unit, a random access memory; and a system bus for coupling the central processing unit to the random access memory. As stated, the system includes the above device along with each of its features. Those features include the semiconductor substrate, dielectric layer on the surface of the substrate and a gate on the surface of the dielectric layer. The gate is greater in length than the dielectric layer and extends past the dielectric layer underneath. A source and drain region are included on the substrate.

Thus an improved performance IGFET is provided which increases the performance, and particularly operation speed, of the IGFET device while maintaining device longevity. The fabrication of the IGFET can be performed without significantly increasing costly fabrication steps. The invention capitalizes on the use of a lightly doped drain junction, a short conduction channel and a dielectric layer which has a high dielectric constant.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which:

FIGS. 1A–1F show cross-sectional views of successive process steps for making an IGFET with short conduction channel length and high aspect gate in accordance with an embodiment of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Method of Fabrication

FIGS. 1A–1E, describe generally various processing techniques of one embodiment of an IGFET which has a short conduction channel length and a high aspect gate.

Figure 1A:
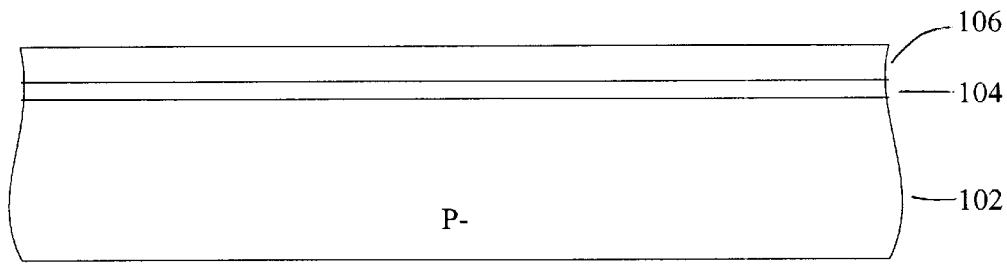

FIG. 1A, illustrates the structure after the following sequence of process steps. A substrate 102 is provide wherein the upper surface of the substrate 102 is an epitaxial layer suitable for integrated circuit manufacture. In one embodiment the substrate 102 is a P-type substrate with a boron background concentration on the order of $1 \times 10^{16}$ atoms/cm$^3$, a <100> orientation and a resistivity of 12 ohm-cm. Preferably, the epitaxial surface layer of the substrate 102 is disposed on a P + base layer (not shown) and includes a planar top surface. In an alternative embodiment, the substrate 102 is an N-type substrate on an N+ base layer.

A dielectric layer 104 is formed on the top surface of the substrate 102. The dielectric layer 104 has a high dielectric constant (K), where the ratio of the dielectric constant of the layer 104 to the dielectric constant of air equals or is greater that one hundred ($\geq 100$). The dielectric layer can be formed through any suitable process, such as by chemical vapor deposition (CVD). Next, a blanket layer of undoped polysilicon 106 is deposited on the top surface of dielectric layer 104. The polysilicon 106 is a suitable gate material and can be deposited by any suitable method, such as by CVD. The upper surface of the structure now shown in FIG. 1A is chemically mechanically polished/planarized (CMP).

Figure 1B:
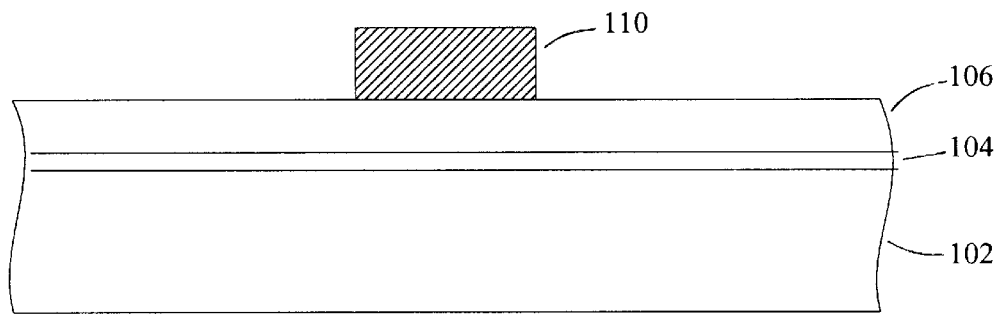

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate region 111.

Figure 1C:
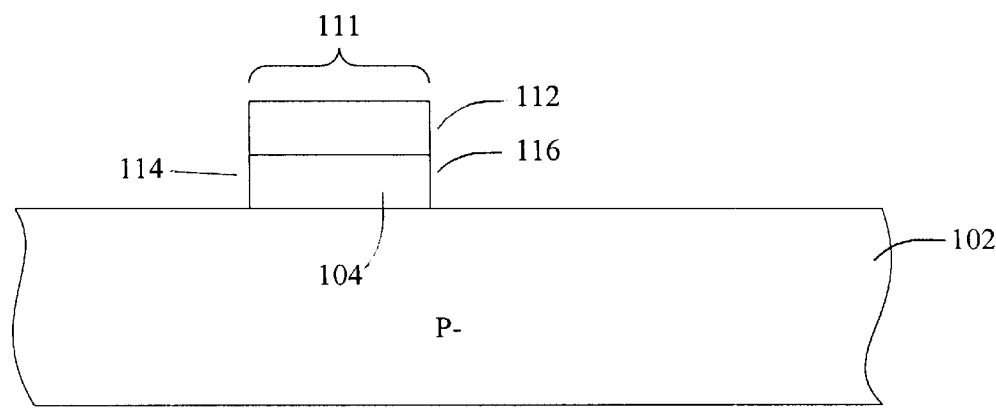

In FIG. 1C, an anisotropic etch is applied that removes the exposed portions of polysilicon 106. Various etchants can be used to anisotropically etch or to selectively remove the polysilicon and oxide layers. Preferably, a first dry or plasma etch is applied that is highly selective of polysilicon. Most of the polysilicon layer 106 is removed, except for the portion beneath the remaining photoresist 110. The dielectric layer 104 is similarly removed. After the etching step or steps, the gate region 111 remains. The gate region includes; the polysilicon layer 106 on top of the dielectric layer 104 on top of the substrate 102. The polysilicon layer 106 serves as a gate 112 and includes opposing vertical sidewalls 114 and 116. The photoresist 110 is stripped, using conventional photoresist stripping techniques. The structure is now as appears in FIG. 1C.

Figure 1D:
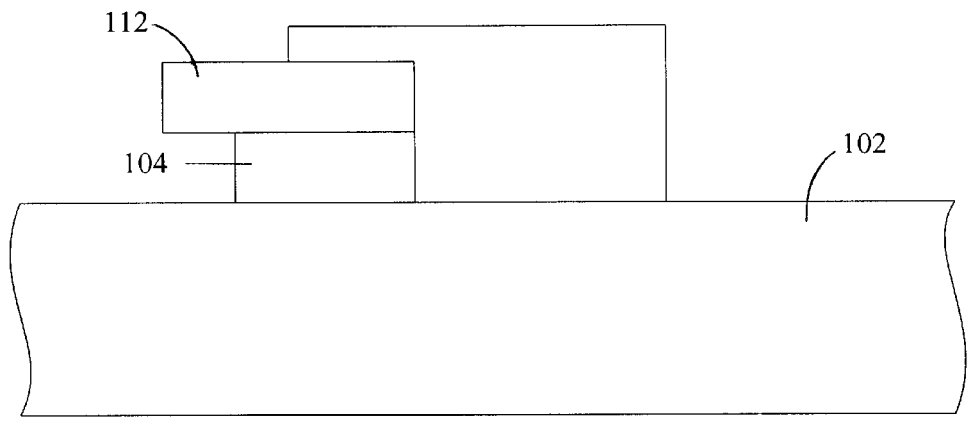

In FIG. 1D, a photoresist is applied and selectively exposed to provide a mask covering on one side of the gate region 111. Next, the exposed edge of the dielectric layer 104 found on side 114 is etched back. The etching is performed by any suitable measure, such as a buffered oxide etch (BOE). In an alternative embodiment the etching may be performed either through a hydroflouric acid etch (HF) or through the use of a plasma etch. In this process, the length of the dielectric layer is reduced to between 0.05 and 0.15 micrometers ($\mu$m). The structure is now as illustrated by FIG. 1D.

Figure 1E:
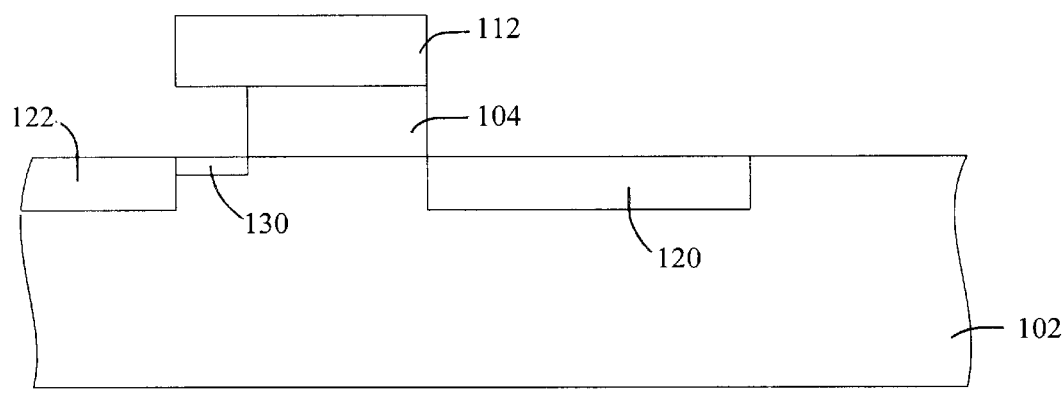
Figure 1E:
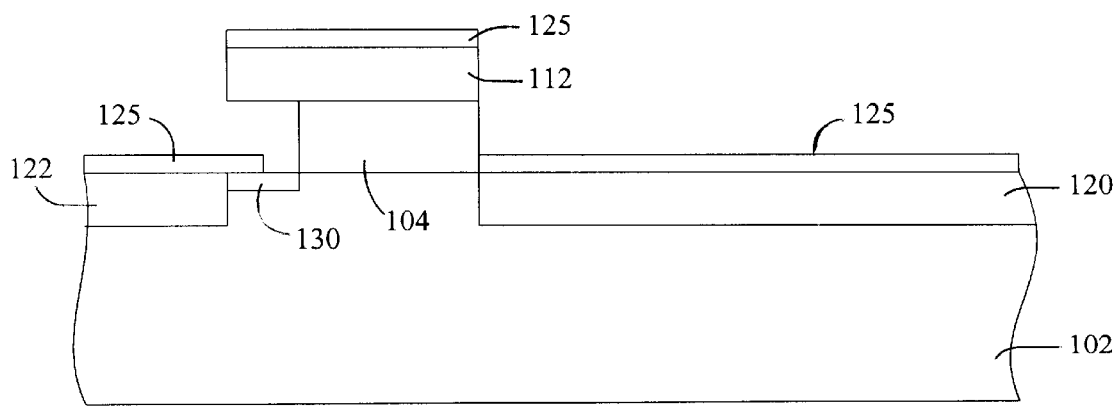

FIG. 1E illustrates the structure following the next set of process steps. A source region 120 and a drain region 122 are provided by implanting ion dopants into the top of the substrate 102. The ion implantation uses conventional ion implanting techniques and the direction of implantation is indicated by arrows 118. In one embodiment, the source and drain regions, 120 and 122 respectively, comprise the n+ silicon material phosphorous. The gate behaves as an implant mask and provides for self-aligned source and drain regions, 120 and 122 respectively. Next, a high temperature rapid thermal anneal (RTA) is conducted in the presence of Arsenic (As) gas. As those skilled in the art will appreciate, this process cures out the crystal damage induced by the previous ion implant process. Additionally, performing this annealing step in the presence of As gas causes an additional doping implantation into the substrate. A lightly doped drain region 130 is formed in the substrate 102, beneath the gate 112, in the region where the dielectric layer 104 has been etched back. The structure is now as shown in FIG. 1E.

FIG. 1F illustrates the structure after the final sequence of process steps. salicide contacts 125 are formed on the gate 112, source 120, drain 122 and lightly doped drain region 114. Additionally contact formation, not included here, is achieved using conventional techniques. These further processing steps are not repeated herein. Likewise, the principal processing steps disclosed herein may be combined with other steps apparent to those skilled in the art.

Figure 2:
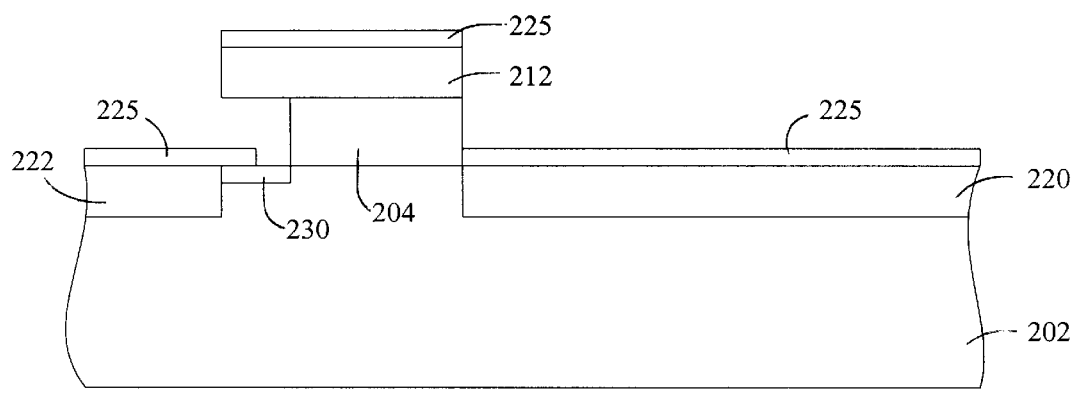
FIG. 2 illustrates the completed IGFET structure in accordance with an embodiment of the invention.

The present invention includes numerous variations to the embodiment described above. For instance, the completed device illustrated FIG. 2 is one embodiment of the invention. FIG. 2 is a cross sectional view wherein a gate 212 is formed on a dielectric layer 204. The dielectric layer 204 has a high dielectric constant (K), where the ratio of the dielectric constant of the layer 204 to the dielectric constant of air equals or is greater that one hundred ($\geq 100$). The length of the gate is longer on one side than the dielectric layer 204 located beneath. The length of the gate 212 is longer than the length of the dielectric 204 due to the application of an etchant which etched back the dielectric layer 204 on one side. A source region 220 and a drain region 222 are provided in a manner that is self aligned with the gate 212. The gate 212 is longer than the dielectric layer on the side which is adjacent to the drain region 222. A lightly doped drain (LDD) region 230 is provided on the substrate 202, beneath the gate 212, in the region where the dielectric layer 204 was etched back. A salicide layer 225 is provided which couples to the source 220, drain 222, lightly doped drain 214 and gate 212 regions. Only a lightly doped drain 214 is formed since it is that portion of the conduction channel which experiences the greatest increase in the electric field. Thus, the region proximate to the drain will be most susceptible to hot carrier effects.

The LDD reduces hot carrier effects by reducing the maximum lateral electric field. Including a heavily doped portion and a lightly doped portion in a source or drain is referred to as having graded doping within the source and drain. IGFETs without graded doping generally have a shortened life which is well below the industry-wide design point of a 10-year life. To extend the life of an IGFET, a drain with a graded, or lightly doped extension is produced. Qualitatively, $\epsilon_{ymax}$ (maximum channel electric field) is reduced by such a graded or lightly doped extension or buffer region because the maximum electric field in a reverse-biased pn junction is highest when the junction is abrupt. By replacing the abrupt drain doping profile of a conventional IGFET with a drain that has a more gradually decreasing lateral doping profile (i.e., a graded drain), the voltage drop becomes shared by the drain and the channel, in contrast to an abrupt n+/p drain junction, in which almost the entire voltage drop occurs across the lightly doped (channel) side of the junction. The model equation for $\epsilon_{ymax}$ is provided below:

$$\epsilon_{ymax} = (V_{DS} - V_{DSsat})/l \quad \text{(Equation 1)}$$

where, $\epsilon_{ymax}$ is the maximum channel electric field, l is the channel length, $V_{DS}$ is the voltage across the channel, and $V_{DSsat}$ is the voltage across the channel at saturation. $\epsilon_{ymax}$ is significantly reduced by the presence of such a lightly doped region because this is another way to increase the denominator of Equation 1.

Thus the invention provides a method and structure for an IGFET which has a shorter conduction channel in the range of 0.05 to 0.15 $\mu$m. This fact allows the IGFET to function more rapidly than do longer conduction channel devices. Also the invention includes a dielectric layer with a K value greater than one hundred (100) to prolong the longevity of the device. A lightly doped drain region similarly preserves the integrity of the IGFET by protecting the gate from "hot electron injection."

Figure 3:
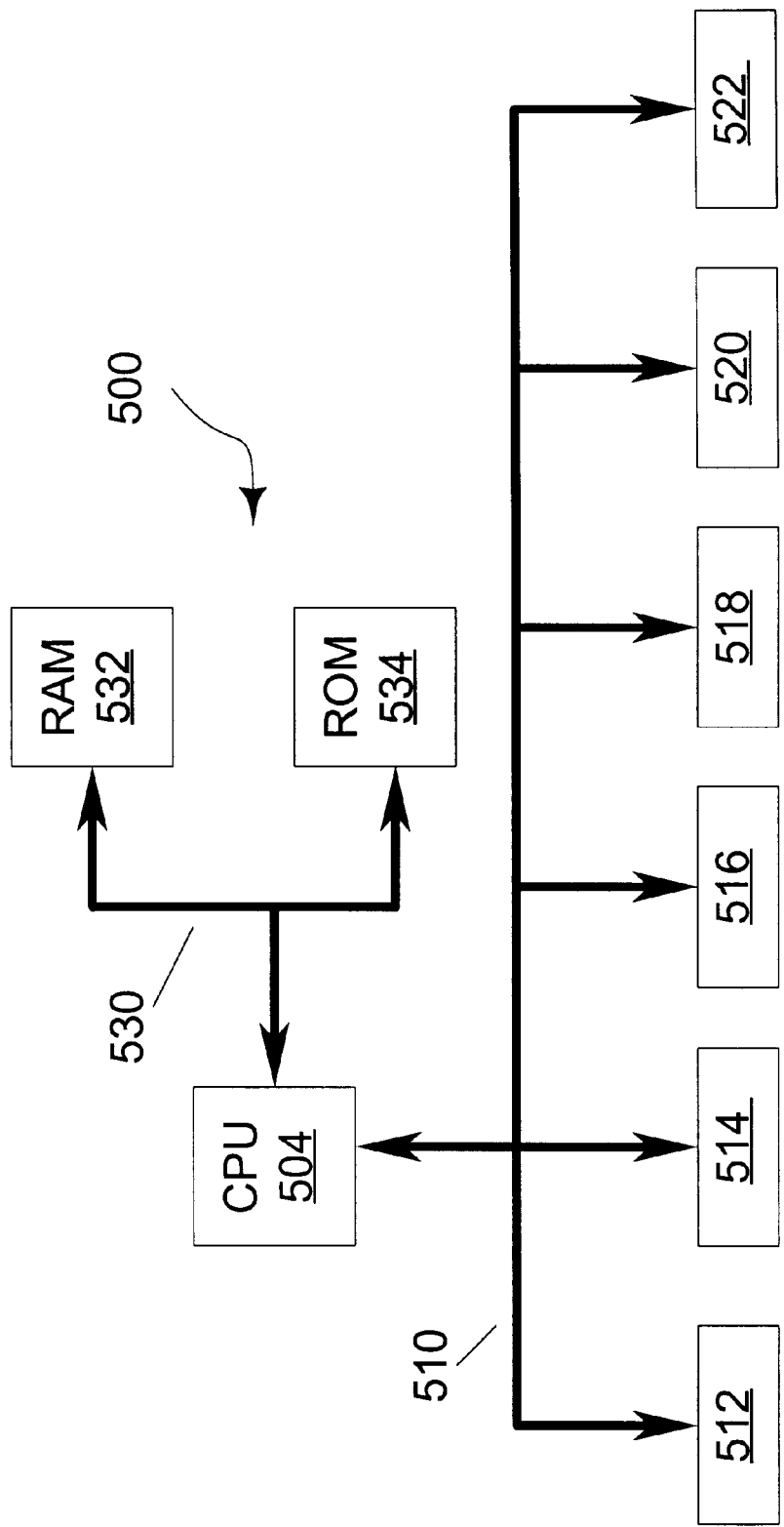
FIG. 3 is a block diagram of an information handling system.

Advantageously, the invention is well-suited for use in a device such as an integrated circuit chip, as well as an electronic system including a microprocessor, a memory and a system bus. The electronic system may also be an information handling system 500 as shown in FIG. 3. The information handling system includes a central processing unit 504, a random access memory (RAM) 532, a read only memory (ROM) 534, and a system bus 530 for communicatively coupling the central processing unit 504 and the RAM 532 and the ROM 534. The system 500 also includes an input/output bus 510 and several devices peripheral devices, such as 512, 514, 516, 518, 520, and 522. The device peripherals attach to the input output bus 510. Peripheral devices include hard disk drives, floppy disk drives, monitors, keyboards and other such peripherals. The information handling system 500 includes a device such as is shown in FIG. 2. The graded doping region in the device provides for a fast and reliable channel having a long life. Faster channels are needed as clocking speeds for microprocessors climb and the channel must also be reliable and long-lived.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A device comprising:
    a dielectric layer on a surface of a semiconductor substrate;
    a gate on a surface of the dielectric layer, the gate having opposing sides, wherein a portion of the gate is greater in length than the dielectric layer, and extends past the dielectric layer underneath on one of the opposing sides;
    a source region within the substrate; and
    a drain region within the substrate.

2. The device of claim 1 further comprising a lightly doped drain region within the substrate and underneath the portion of the gate and is longer in length than the dielectric layer.

3. The device of claim 1 wherein the dielectric layer material comprises a material having a high dielectric constant.

4. The device of claim 1 wherein the length difference between the gate and the dielectric layer is formed by applying an etchant to the dielectric layer underneath the gate.

5. The device of claim 1 wherein the drain region is disposed adjacent to the portion of the gate which is greater in length than the dielectric layer.

6. The device of claim 1 wherein the source region and the drain region are self-aligned with the gate.

7. The device of claim 2 wherein the lightly doped drain region is formed from Arsenic (As).

8. The device of claim 1 further comprising a salicidation layer on the source region, the drain and lightly doped drain regions, and the gate.

9. An information handling system comprising:
    a central processing unit;
    a random access memory; and
    a system bus for communicatively coupling the central processing unit and the random access memory, said information handling system further including at least one device comprising:
        a dielectric layer on a surface of a semiconductor substrate;
        a gate on a surface of the dielectric layer, the gate having opposing sides, wherein a portion of the gate is greater in length than the dielectric layer and extends past the dielectric layer underneath on one of the opposing sides;

a source region within the substrate; and a drain region within the substrate.

10. The information handling system of claim 9 further comprising a lightly doped drain within the substrate and underneath the portion of the gate and is longer in length than the dielectric layer.

11. The information handling system of claim 9 wherein the dielectric layer comprises a material having a high dielectric constant.

\* \* \* \* \*

UNITED STATES PATENT AND TRADEMARK OFFICE
CERTIFICATE OF CORRECTION

PATENT NO.    : 5,969,394
DATED         : October 19, 1999
INVENTOR(S)   : Gardner et al.

It is certified that error appears in the above-identified patent and that said Letters Patent is hereby corrected as shown below:

Column 1,
Line 56, "finctionality" should read -- functionality --.
Line 64, "reduced" should read -- reduce --.

Column 2,
Line 13, "achieve improved these sought" should read -- achieve these sought --.
Line 18, "increase and while not compromise" should read -- while not compromising --.
Line 39, "hydroflouric" should read -- hydrofluoric --.

Column 3,
Line 46, "provide" should read -- provided --.

Column 4,
Line 34, "hydroflouric" should read -- hydrofluoric --.
Line 61, "salicide" should read -- Salicide --.

Column 5,
Line 63, "well-suited" should read -- well suited --.

Signed and Sealed this

Third Day of December, 2002

JAMES E. ROGAN
*Director of the United States Patent and Trademark Office*